US009673318B1

(12) United States Patent
Mirchandani et al.

(10) Patent No.: US 9,673,318 B1
(45) Date of Patent: Jun. 6, 2017

(54) SEMICONDUCTOR DEVICE INCLUDING A GATE TRENCH HAVING A GATE ELECTRODE LOCATED ABOVE A BURIED ELECTRODE

(71) Applicant: Infineon Technologies Americas Corp., El Segundo, CA (US)

(72) Inventors: Ashita Mirchandani, Torrance, CA (US); Timothy D. Henson, Mount Shasta, CA (US)

(73) Assignee: Infineon Technologies Americas Corp., El Segundo, CA (US)

( * ) Notice: Subject to any disclaimer, the term of this patent is extended or adjusted under 35 U.S.C. 154(b) by 0 days.

(21) Appl. No.: 14/995,049

(22) Filed: Jan. 13, 2016

(51) Int. Cl.
| | |
|---|---|
| *H01L 29/423* | (2006.01) |
| *H01L 29/78* | (2006.01) |
| *H01L 29/40* | (2006.01) |
| *H01L 29/06* | (2006.01) |
| *H01L 29/10* | (2006.01) |
| *H01L 29/08* | (2006.01) |
| *H01L 29/417* | (2006.01) |

(52) U.S. Cl.
CPC ........ *H01L 29/7813* (2013.01); *H01L 29/063* (2013.01); *H01L 29/0869* (2013.01); *H01L 29/1095* (2013.01); *H01L 29/407* (2013.01); *H01L 29/41741* (2013.01); *H01L 29/42372* (2013.01)

(58) Field of Classification Search
CPC .............. H01L 29/063; H01L 29/0847; H01L 29/0869; H01L 29/1079; H01L 29/1087; H01L 29/1095; H01L 29/407; H01L 29/41741; H01L 29/41766; H01L 29/42372; H01L 29/7813; H01L 29/7827
See application file for complete search history.

(56) References Cited

U.S. PATENT DOCUMENTS

| | | | | |
|---|---|---|---|---|
| 7,633,119 B2 * | 12/2009 | Bhalla | ................... | H01L 29/407 |
| | | | | 257/330 |
| 2006/0076614 A1 * | 4/2006 | Ninomiya | ........... | H01L 29/0634 |
| | | | | 257/330 |
| 2006/0214221 A1 * | 9/2006 | Challa | ................. | H01L 21/3065 |
| | | | | 257/328 |

* cited by examiner

*Primary Examiner* — Stephen W Smoot
(74) *Attorney, Agent, or Firm* — Murphy, Bilak & Homiller, PLLC

(57) ABSTRACT

A semiconductor device includes a semiconductor substrate having a base region situated over a drift region, a source trench extending through the base region and into the drift region, the source trench having a shield electrode, a gate trench extending through the base region and into the drift region, the gate trench adjacent the source trench, the gate trench having a gate electrode situated above a buried electrode. The source trench is surrounded by the gate trench. The shield electrode is coupled to a source contact over the semiconductor substrate. The semiconductor device also includes a source region over the base region. The gate trench includes gate trench dielectrics lining a bottom and sidewalls of the gate trench. The source trench includes source trench dielectrics lining a bottom and sidewalls of the source trench.

20 Claims, 3 Drawing Sheets

SEMICONDUCTOR DEVICE INCLUDING A GATE TRENCH HAVING A GATE ELECTRODE LOCATED ABOVE A BURIED ELECTRODE

BACKGROUND

In trench type semiconductor devices, such as trench type metal oxide semiconductor field effect transistors (MOSFETs), on-state resistance ($R_{DSon}$), breakdown voltage and avalanche ruggedness are important performance parameters. The on-state resistance is the drain-to-source resistance of the trench type semiconductor device in an on-state. The breakdown voltage is the voltage at which a reverse biased drift-base p-n junction breaks down and significant current starts to flow between a source and a drain of the trench type semiconductor device by an avalanche multiplication process. In the avalanche multiplication process, impact ionization of electron-hole pairs can generate avalanche current between the drain and a base region of the semiconductor device. The avalanche ruggedness characterizes the trench type semiconductor device's capability to withstand the avalanche current when subjected to, for example, unclamped inductive switching.

Buried electrode or oxide field plate trench type semiconductor devices have been utilized to improve performance parameters, such as higher device breakdown voltage and lower on-resistance. Conventionally, one technique for reducing the on-state resistance in a buried electrode trench type semiconductor device involves reducing the cell pitch of the semiconductor device and consequently shrinking the width of the silicon mesa separating two neighboring gate trenches, in order to increase the doping concentration of a drift region for a desired breakdown voltage. However, reducing the width of the silicon mesa is constrained by the body/source contact formation, which requires a minimum contact opening width for an adequate fill of the contact metallization. In addition, the avalanche ruggedness is of particular concern in applications where the semiconductor device is susceptible to repetitive avalanche cycles, which can lead to significant parametric shift over time if the semiconductor device is not sufficiently rugged.

Accordingly, there is a need to overcome the drawbacks and deficiencies in the art by providing a semiconductor device having a structure to improve avalanche ruggedness and figures of merit, such as on-state resistance and breakdown voltage.

SUMMARY

The present disclosure is directed to a semiconductor device with trench structure, substantially as shown in and/or described in connection with at least one of the figures, and as set forth in the claims.

DETAILED DESCRIPTION

Figure 1:
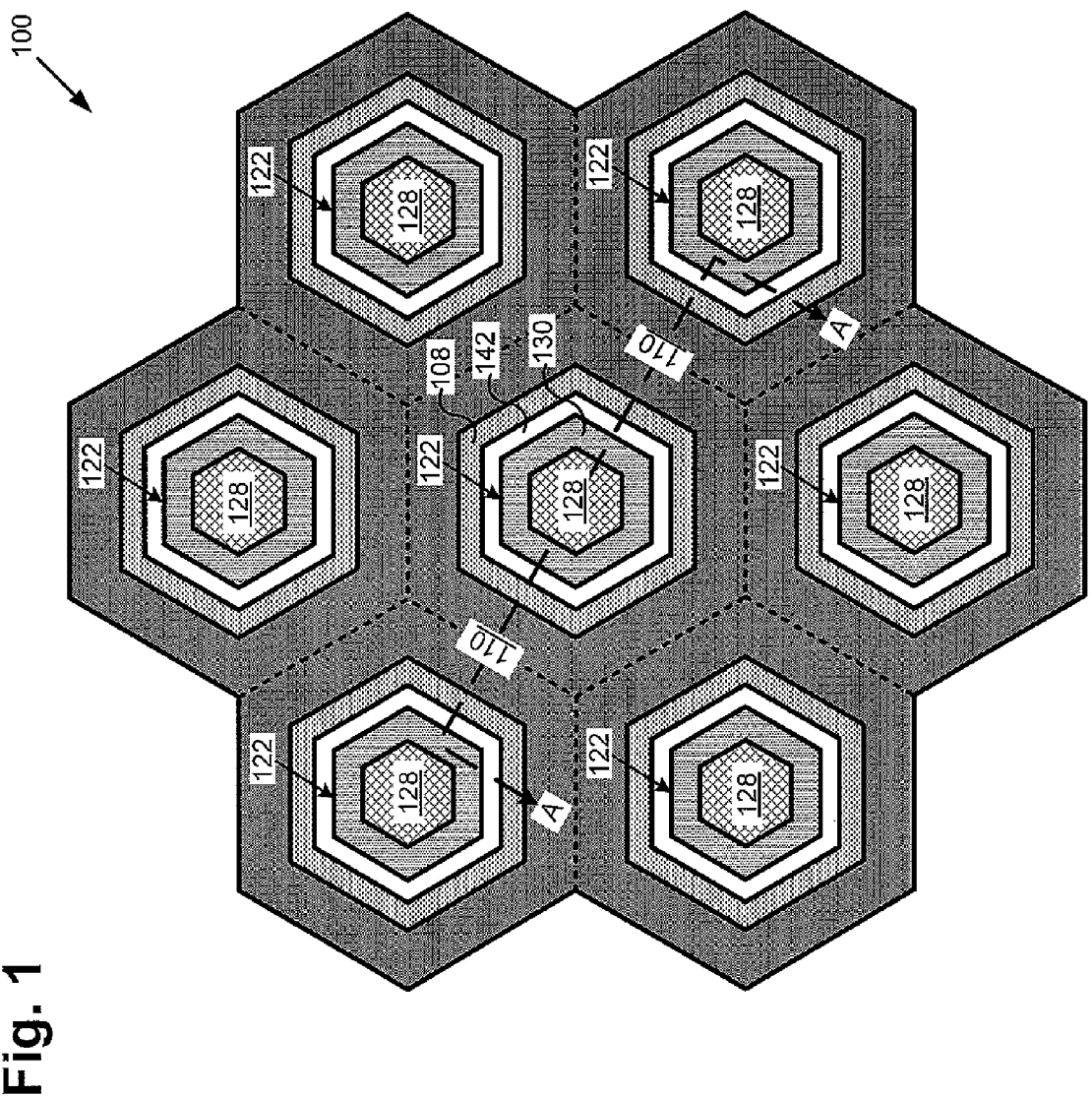
FIG. 1 illustrates a top plan view of a portion of an exemplary semiconductor device, according to one implementation of the present application.

The following description contains specific information pertaining to implementations in the present disclosure. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions.

FIG. 1 illustrates a top plan view of a portion of an exemplary semiconductor device, according to one implementation of the present application. Semiconductor device 100 includes gate trenches 110 and source trenches 122 formed in a semiconductor substrate. Semiconductor device 100 also includes source regions 108 and body contact regions 142 near a top surface of the semiconductor substrate. The semiconductor substrate also includes a drift region over a drain region, and base regions over the drift region, which are not explicitly shown in FIG. 1. It is noted that certain features, such as a source contact and a gate dielectric cap, have been omitted from FIG. 1 to preserve clarity.

In the present implementation, in each cellular structure, source trench 122 extends from the top surface of the semiconductor substrate into the drift region (not explicitly shown in FIG. 1). As illustrated in FIG. 1, each source trench 122 includes shield electrode 128 surrounded by source trench dielectrics 130 in source trench 122. Source trench 122 is surrounded by body contact region 142 near the top surface of the semiconductor substrate. Body contact region 142 is surrounded by source region 108 near the top surface of the semiconductor substrate. Each gate trench 110 extends from the top surface of the semiconductor substrate into the drift region (not explicitly shown in FIG. 1), and includes a gate electrode (not explicitly shown in FIG. 1) and a buried electrode (not explicitly shown in FIG. 1) situated below the gate electrode, where the buried electrode is insulated from the gate electrode by gate trench dielectrics (not explicitly shown in FIG. 1). In each cellular structure, gate trench 110 surrounds source region 108, body contact region 142 and source trench 122 in the semiconductor substrate. It should be noted that, although, in the present implementation, source trenches 122 and gate trenches 110 are shown to be in cellular hexagonal shapes, in other implementations, source trenches 122 and gate trenches 110 may be in other suitable cellular shapes, such as in circular shapes or square shapes. In yet another implementation, source trenches 122 and gate trenches 110 may be arranged in a stripe layout (not explicitly shown in FIG. 1) with parallel alternating source and gate trenches.

Figure 2:
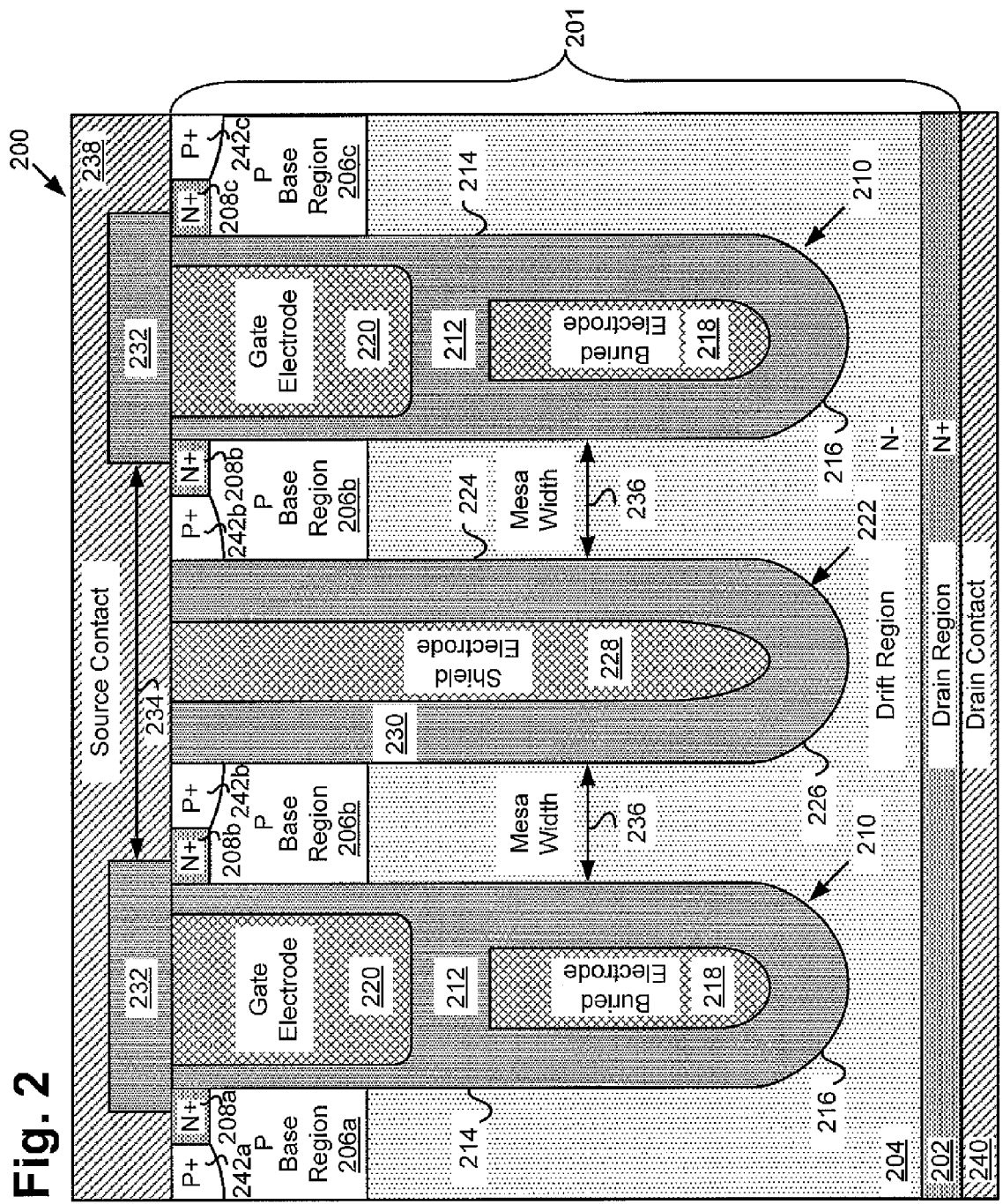
FIG. 2 illustrates a cross-sectional view of a portion of an exemplary semiconductor device, according to one implementation of the present application.

Turning to FIG. 2, FIG. 2 corresponds to a cross-sectional view of structure 100 in FIG. 1 along line A-A, according to one implementation of the present application. As illustrated in FIG. 2, semiconductor device 200 includes semiconductor substrate 201 having drain region 202, drift region 204, base regions 206a, 206b and 206e (collectively referred to as base regions 206), source regions 208a, 208b and 208c (collectively referred to as source regions 208), and body contact regions 242a, 242b and 242c (collectively referred to as body contact regions 242). Semiconductor device 200 also includes source trench 222 adjacent gate trench 210 in semiconductor substrate 201. Source trench 222 extends through base region 206b and into drift region 204. Gate trench 210 also extends through base region 206b and into drift region 204. As illustrated in FIG. 2, body contact regions 242a, 242b and 242c are situated near a top surface of semiconductor substrate 201, where body contact region 242b surrounds source trench 222. Source regions 208a, 208b and 208c are also situated near the top surface of semiconductor substrate 201, where source region 208b surrounds body contact region 242b. With reference to FIGS. 1 and 2, it should be understood that body contact region 242b, source region 208b and source trench 222 are surrounded by gate trench 210. Semiconductor device 200 also includes drain contact 240 coupled to drain region 202, and source contact 238 coupled to source regions 208a, 208b and 208c, body contact regions 242a, 242b and 242c, buried electrode 218 in gate trench 210, and shield electrode 228 in source trench 222.

As illustrated in FIG. 2, body contact regions 242a, 242b and 242c and source regions 208a, 208b and 208c are situated near the top surface of semiconductor substrate 201 and over base regions 206a, 206b and 206c, respectively. Base regions 206a, 206b and 206c are situated over drift region 204. Drift region 204 is situated over drain region 202. In the present implementation, drain region 202, drift region 204, base regions 206a, 206b and 206c, source regions 208a, 208b and 208c and body contact regions 242a, 242b and 242c may each include semiconductor material. For example, drain region 202, drift region 204, base regions 206a, 206b and 206c, source regions 208a, 208b and 208c and body contact regions 242a, 242b and 242c may each be silicon.

In the present implementation, drain region 202 is formed in semiconductor substrate 201, such as a silicon substrate. Drain region 202 is of a first conductivity type and is shown as having N+ conductivity by way of example. Drift region 204 includes epitaxial silicon grown on drain region 202. Drift region 204 is of the first conductivity type and is shown as having N− conductivity by way of example. Base regions 206a, 206b and 206c are of a second conductivity type and are shown as having P conductivity by way of example. Source regions 208a, 208b and 208c are of the first conductivity type and are shown as having N+ conductivity by way of example. Body contact regions 242a, 242b and 242c are of the second conductivity type and are shown as having P+ conductivity by way of example. Drain region 202, drift region 204, base regions 206a, 206b and 206c, source regions 208a, 208b and 208c and body contact regions 242a, 242b and 242c may be formed by etching and/or doping semiconductor substrate 201. However, in another implementation, drain region 202, drift region 204, base regions 206a, 206b and 206c, source regions 208a, 208b and 208c and body contact regions 242a, 242b and 242c may each include the opposite conductivity type, and be formed in various ways without deviating from the scope of the present disclosure.

As illustrated in FIG. 2, gate trench 210 extends through base region 206b and into drift region 204. Gate trench 210 has opposing sidewalls 214, which are substantially parallel to one another (in the present example) and extend into bottom 216. Gate trench 210 includes buried electrode 218, gate electrode 220 situated above buried electrode 218, and gate trench dielectrics 212, where gate trench dielectrics 212 line sidewalls 214 and bottom 216 of gate trench 210, and isolate gate electrode 220 from buried electrode 218. For example, forming gate trench 210 may include etching into drift region 204. Forming gate trench dielectrics 212 may include depositing and/or thermally growing dielectric material in gate trench 210. Gate trench dielectrics 212 may be, for example, silicon dioxide. Forming buried electrode 218 may include depositing conductive material in a lower portion of gate trench 210. Gate trench dielectrics 212 may be formed over buried electrode 218 to isolate buried electrode 218 from subsequently formed gate electrode 220. Next, forming gate electrode 220 may include depositing conductive material in an upper portion of gate trench 210. The conductive material for buried electrode 218 and/or gate electrode 220 may include, for example, metal and/or metal alloy or polysilicon. Etch-back and/or another planarization technique may be utilized on the conductive material to form gate electrode 220. Gate dielectric cap 232 is formed over gate trench 210. Gate dielectric cap 232 includes dielectric material and electrically insulates gate electrode 220 from source contact 238.

As illustrated in FIG. 2, source trench 222 extends through base region 206b and into drift region 204. Source trench 222 has opposing sidewalls 224, which are substantially parallel to one another (in the present example) and extend into bottom 226. Source trench 222 includes source trench dielectrics 230, which line sidewalls 224 and bottom 226 of source trench 222. For example, forming source trench 222 may include etching into drift region 204. Forming source trench dielectrics 230 may include depositing and/or thermally growing dielectric material in source trench 222. Source trench dielectrics 230 may be, for example, silicon dioxide. Forming shield electrode 228 may include depositing conductive material in source trench 222 over source trench dielectrics 230. The conductive material for shield electrode 228 may include, for example, metal and/or metal alloy or polysilicon. Etch-back and/or another planarization technique may be utilized on the conductive material to form shield electrode 228.

As illustrated in FIG. 2, source regions 208a, 208b and 208c are formed adjacent each of sidewalls 214 of gate trench 210. Source regions 208a, 208b and 208c are of the first conductivity type and have N+ conductivity by way of example. Source regions 208a, 208b and 208c may be formed, for example, by doping semiconductor substrate 201. Source regions 208a, 208b and 208c are situated over base regions 206a, 206b and 206c, respectively. Body contact regions 242a, 242b and 242c are of the second conductivity type and are shown as having P+ conductivity by way of example. Body contact regions 242a, 242b and 242c may be formed, for example, by doping semiconductor substrate 201. Body contact regions 242a, 242b and 242c are situated over base regions 206a, 206b and 206c, respectively. Base regions 206a, 206b and 206c are of the second conductivity type and are shown as having P conductivity by way of example. Base regions 206a, 206b and 206c may be formed, for example, by doping semiconductor substrate 201. In semiconductor device 200, base region 206b is situated between gate trench 210 and source trench 222.

Also in semiconductor device 200, source contact 238 is situated on and electrically connected to body contact regions 242a, 242b and 242c, source regions 208a, 208b and 208c, buried electrode 218 in gate trench 210, and shield electrode 228 in source trench 222. Drain contact 240 is situated below and electrically connected to drain region 202. Source contact 238 and drain contact 240 include conductive material, such as metal and/or metal alloy, and are utilized to form a current path between drain region 202 and source regions 208 during conduction of semiconductor device 200.

In the present implementation, source trench 222 having shield electrode 228 and gate trench 210 having buried electrode 218 are configured to achieve a charge balancing effect and enable two-dimensional depletion of a heavily doped drift region between gate trench 210 and source trench 222. As illustrated in FIG. 2, gate trench 210 includes buried electrode 218 and gate electrode 220 situated above and separated from buried electrode 218 by gate trench dielectrics 212 (e.g., an inter-poly dielectric) in gate trench 210. Shield electrode 228 in source trench 222 and buried electrode 218 in gate trench 210 are connected to a source potential, which is also applied to source regions 208a, 208b and 208c and body contact regions 242a, 242b and 242c. Buried electrode 218 provides the benefit of shielding gate electrode 220 from the electric fields in the underlying epitaxial drain region, thereby substantially reducing the gate-drain capacitance. Source trench 222 includes shield electrode 228 lined by source trench dielectrics 230, where shield electrode 228 extends up to the top surface of the semiconductor body, and is directly connected to source contact 238. The combination of buried electrode 218 and shield electrode 228 offers benefits, such as increased device breakdown voltage with significantly higher drift region doping concentration and hence much lower on-resistance.

As illustrated in FIG. 2, source trench 222 is spaced to be substantially centered in the region formed by surrounding gate trench 210. In contrast to conventional semiconductor device in which the width of the silicon mesa is constrained by the minimum size requirement of the contact opening for adequate body/source contact formation, implementations of the present application utilize cellular structures each having source trench 222 surrounded by gate trench 210, where shield electrode 228 in source trench 222 is in direct contact with source contact 238, thus not covered by gate dielectric cap 232. As a result, mesa width 236 between gate trench 210 and source trench 222 can be substantially reduced, while body/source contact opening width 234 remains sufficiently large to meet the minimum size requirement of the contact opening to ensure adequate body/source contact formation. As can be seen in FIG. 2, body/source contact opening width 234 spans the width of source trench 222 (where source contact 238 is directly connected to shield electrode 228 in source trench 222) and is large enough to achieve a void-free metal fill in the contact opening. Thus, mesa width 236 can be reduced down to much smaller values than conventional trench type semiconductor devices, while enabling the use of higher doping concentration in drift region 204 to lower $R_{DSon}$.

The unique construction of gate trench 210 and source trench 222 can improve avalanche performance as compared to a conventional trench type semiconductor device, in which the entire hole current generated during an avalanche condition flows along a gate electrode and traverses under a source region before being collected by a body contact, making the semiconductor device susceptible to parasitic bipolar turn-on. During regular operation, gate electrode 220 can be utilized to selectively enable and disable semiconductor device 200 by modulating channels adjacent gate trench dielectrics 212 in base regions 206a, 206b and 206c. However, during, for example, unclamped inductive switching, semiconductor device 200 may be connected to an inductor and experience a rapid change in current. When semiconductor device 200 is on, energy is stored in the inductor. When semiconductor device 200 is switched off, the inductor dissipates the stored energy into semiconductor device 200 by driving it into an avalanche condition, resulting in elevated junction temperature of semiconductor device 200. In the avalanche condition, impact ionization of electron-hole pairs can generate avalanche current between drain region 202 of semiconductor device 200 and base regions 206a, 206b and 206c of semiconductor device 200.

The avalanche condition poses a threat of damaging semiconductor device 200, which may result in shift of device parameters such as threshold voltage (Vth), on-state resistance ($R_{DSon}$), and drain to source leakage (Idss).

In the present implementation, source trench 222 is configured to provide respective enhanced avalanche current paths from drain region 202 to respective ones of base regions 206a, 206b and 206c when semiconductor device 200 is in an avalanche condition. By contrast, in a conventional buried source semiconductor device without a source trench, each avalanche current path from a drain region to one or more base regions can traverse a drift region adjacent a bottom and sidewalls of a gate trench. High electric fields during an avalanche condition can concentrate along the bottom and the sidewalls of the gate trench. At high temperatures, these high electric fields along with high avalanche current densities may result in carriers being injected into the gate trench dielectrics. This can cause significant shift of device parameters such as, for example, threshold voltage (Vth), on-state resistance ($R_{DSon}$), and drain to source leakage (Idss) and can compromise the ruggedness of the conventional buried source semiconductor device.

With the presence of source trench 222, however, a portion of the avalanche current is diverted away from gate trench 210 during an avalanche condition. As such, high electric fields and avalanche current densities may be evenly distributed along sidewalls 214 of gate trench 210 and sidewalls 224 of source trench 222, thereby significantly reducing or eliminating the risk of carriers being injected into gate trench dielectrics 212. In other words, the impact ionization is triggered at both bottom 216 of gate trench 210 and bottom 226 of source trench 222, with a fraction of the avalanche current flowing along sidewalls 214 of gate trench 210, and the remainder of the avalanche current flowing along sidewalls 224 of source trench 222. Thus, source trench 222 is configured to divert the avalanche current from sidewalls 214 of gate trench 210 thereby significantly reducing the threat of damaging semiconductor device 200.

Furthermore, the diverted avalanche current that flows along sidewalls 224 of source trench 222 has direct access to body contact region 242b without having to traverse under source regions 208b. In turn, only a fraction of the avalanche current flows along gate trench 210 and traverses under source region 208 before being collected by body contact regions 242. As a result, semiconductor device 200 is substantially immune from parasitic bipolar turn-on, and can substantially avoid or minimize parametric shift due to repetitive avalanche conditions. Thus, semiconductor device 200 has enhanced avalanche ruggedness as compared to conventional trench type semiconductor devices.

In the present implementation, semiconductor device 200 is a trench type MOSFET and can have various configurations and features, which may be different than what is specifically shown. In one implementation, gate trench 210 and source trench 222 may have the same critical dimensions and depth. In another implementation, gate trench 210 and source trench 222 may different critical dimensions and depths. Source trench dielectrics 230 and gate trench dielectrics 212 may be of the same or different thickness. Depending on the application requirements, the critical dimensions, depth and dielectric thickness of gate trench 210 and source trench 222 may be optimized independently to offer the best device performance.

Figure 3:
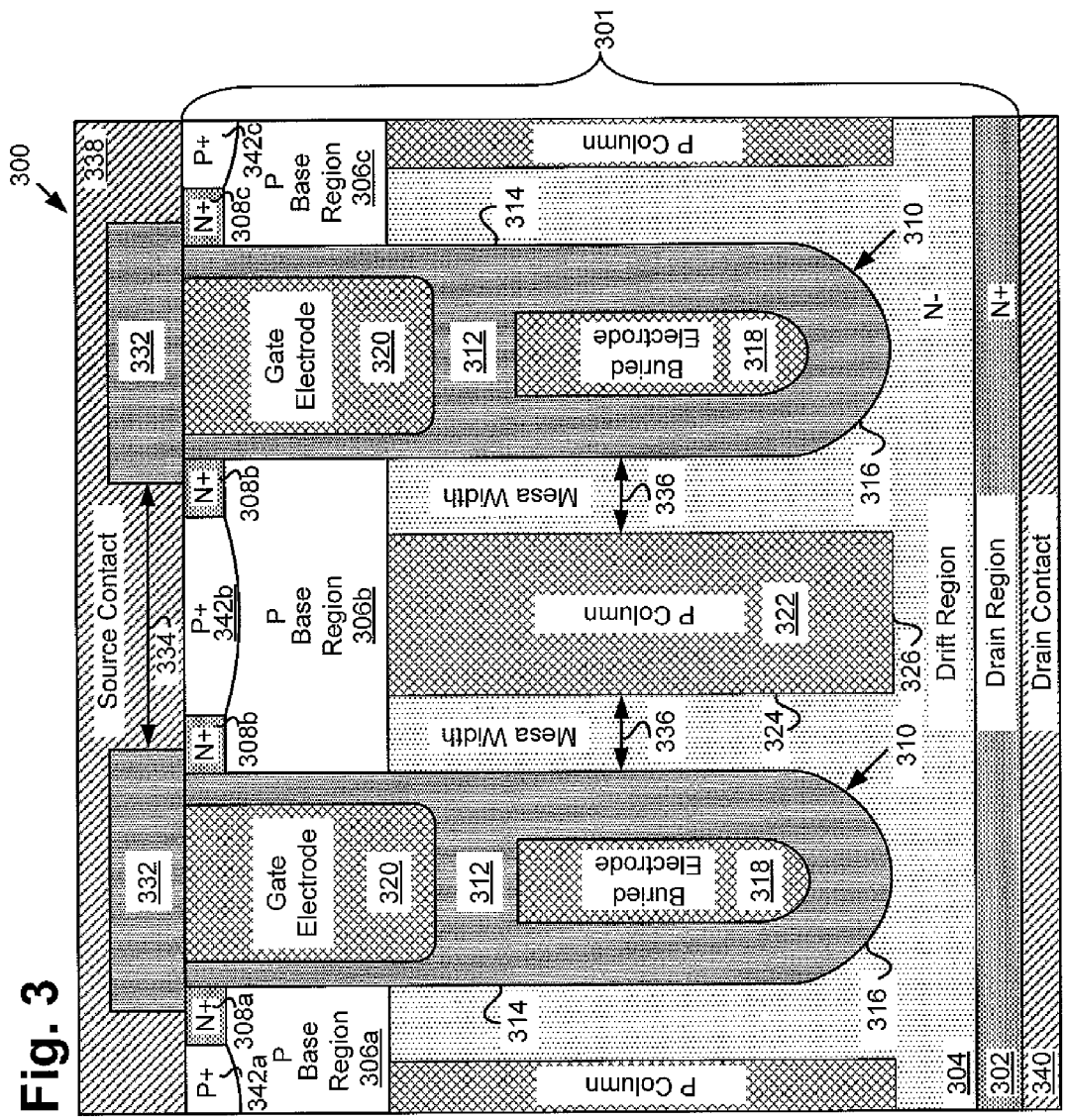
FIG. 3 illustrates a cross-sectional view of a portion of an exemplary semiconductor device, according to one implementation of the present application.

Turning to FIG. 3, FIG. 3 illustrates a cross-sectional view of a portion of an exemplary semiconductor device, according to one implementation of the present application. Semiconductor device 300 includes semiconductor substrate 301 having drain region 302, drift region 304, base regions 306a, 306b and 306c (collectively referred to as base regions 306), source regions 308a, 308b and 308c (collectively referred to as source regions 308), and body contact regions 342a, 342b and 342c (collectively referred to as body contact regions 342). Semiconductor device 300 also includes doped pillar 322 adjacent gate trench 310 in semiconductor substrate 301. Doped pillar 322 is situated below base region 306b, and extends into drift region 304. Gate trench 310 extends through base region 306b into drift region 304. As illustrated in FIG. 3, body contact regions 342a, 342b and 342c are situated near a top surface of semiconductor substrate 301. Source regions 308a, 308b and 308c are also situated near the top surface of semiconductor substrate 301, where source region 308b surrounds body contact region 342b. It should be noted that body contact region 342b and source region 308b are surrounded by gate trench 310. Semiconductor device 300 also includes drain contact 340 coupled to drain region 302, and source contact 338 coupled to source regions 308a, 308b and 308c, and body contact regions 342a, 342b and 342c.

As illustrated in FIG. 3, body contact regions 342a, 342b and 342c and source regions 308a, 308b and 308c are situated near the top surface of semiconductor substrate 301 and over base regions 306a, 306b and 306c, respectively. Base regions 306a, 306b and 306c are situated over drift region 304. Drift region 304 is situated over drain region 302. In the present implementation, drain region 302, drift region 304, base regions 306a, 306b and 306c, source regions 308a, 308b and 308c and body contact regions 342a, 232b and 342c may each include semiconductor material. For example, drain region 302, drift region 304, base regions 306a, 306b and 306c, source regions 308a, 308b and 308c and body contact regions 342a, 232b and 342c may each be silicon.

In the present implementation, drain region 302 is formed in semiconductor substrate 301, such as a silicon substrate. Drain region 302 is of a first conductivity type and is shown as having N+ conductivity by way of example. Drift region 304 includes epitaxial silicon grown on drain region 302. Drift region 304 is of the first conductivity type and is shown as having N− conductivity by way of example. Base regions 306a, 306b and 306c are of a second conductivity type and are shown as having P conductivity by way of example. Source regions 308a, 308b and 308c are of the first conductivity type and are shown as having N+ conductivity by way of example. Body contact regions 342a, 342b and 342c are of the second conductivity type and are shown as having P+ conductivity by way of example. Drain region 302, drift region 304, base regions 306a, 306b and 306c, source regions 308a, 308b and 308c and body contact regions 342a, 342b and 342c may be formed by etching and/or doping semiconductor substrate 301. However, in another implementation, drain region 302, drift region 304, base regions 306a, 306b and 306c, source regions 308a, 308b and 308c and body contact regions 342a, 342b and 342c may each include the opposite conductivity type, and be formed in various ways without deviating from the scope of the present disclosure.

As illustrated in FIG. 3, gate trench 310 extends through base region 306b and into drift region 304. Gate trench 310 has opposing sidewalls 314, which are substantially parallel to one another (in the present example) and extend into bottom 316. Gate trench 310 includes buried electrode 318, gate electrode 320 situated above buried electrode 318, and gate trench dielectrics 312, where gate trench dielectrics 312 line sidewalls 314 and bottom 316 of gate trench 310, and isolate gate electrode 320 from buried electrode 318. For example, forming gate trench 310 may include etching into drift region 304. Forming gate trench dielectrics 312 may include depositing and/or thermally growing dielectric material in gate trench 310. Gate trench dielectrics 312 may be, for example, silicon dioxide. Forming buried electrode 318 may include depositing conductive material in a lower portion of gate trench 310. Gate trench dielectrics 312 may be formed over buried electrode 318 to isolate buried electrode 318 from subsequently formed gate electrode 320. Next, forming gate electrode 320 may include depositing conductive material in an upper portion of gate trench 310. The conductive material for buried electrode 318 and/or gate electrode 320 may include, for example, metal and/or metal alloy or polysilicon. Etch-back and/or another planarization technique may be utilized on the conductive material to form gate electrode 320. Gate dielectric cap 332 is formed over gate trench 310. Gate dielectric cap 332 includes dielectric material and electrically insulates gate electrode 320 from source contact 338.

As illustrated in FIG. 3, doped pillar 322 is situated below base region 306b, and extends into drift region 304. In the present implementation, doped pillar 322 is of the second conductivity type and is shown as having P conductivity by way of example. Doped pillar 322 has opposing sidewalls 324, which are substantially parallel to one another (in the present example) and extend into bottom 326. Doped pillar 322 may be a P column formed by growing multiple epitaxial layers, with each layer of epitaxial growth followed by P-type implantation in the area of interest. In another implementation, doped pillar 322 may be formed by implantation through a narrow opening in the silicon mesa surrounded by gate trench 310. In yet another implementation, doped pillar 322 may be formed by etching into silicon and growing or depositing the doped region. It should be noted that although, in the present implementation, doped pillar 322 is situated below base region 306b, in other implementations, doped pillar 322 may extend through base region 306b and up to body contact region 342b or source contact 338.

As illustrated in FIG. 3, source regions 308a, 308b and 308c are formed adjacent each of sidewalls 314 of gate trench 310. Source regions 308a, 308b and 308c are of the first conductivity type and have N+ conductivity by way of example. Source regions 308a, 308b and 308c may be formed, for example, by doping semiconductor substrate 301. Source regions 308a, 308b and 308c are situated over base regions 306a, 306b and 306c, respectively. Body contact regions 342a, 342b and 342c are of the second conductivity type and are shown as having P+ conductivity by way of example. Body contact regions 342a, 342b and 342c may be formed, for example, by doping semiconductor substrate 301. Body contact regions 342a, 342b and 342c are situated over base regions 306a, 306b and 306c, respectively. Base regions 306a, 306b and 306c are of the second conductivity type and are shown as having P conductivity by way of example. Base regions 306a, 306b and 306c may be formed, for example, by doping semiconductor substrate 301. In semiconductor device 300, base region 306b is situated between gate trench 310.

Also in semiconductor device 300, source contact 338 is situated on and electrically connected to body contact regions 342a, 342b and 342c, and source regions 308a, 308b and 308c, buried electrode 318 in gate trench 310, and doped pillar 322 through body contact region 342b and base region 306l). Drain contact 340 is situated below and electrically connected to drain region 302. Source contact 338 and drain contact 340 include conductive material, such as metal and/or metal alloy, and are utilized to form a current path between drain region 302 and source regions 308 during conduction of semiconductor device 300.

Similar to semiconductor device 200 in FIG. 2, doped pillar 322 and gate trench 310 having buried electrode 318 are configured to achieve a charge balancing effect and enable two-dimensional depletion of a heavily doped drift region between gate trench 310 and doped pillar 322. As illustrated in FIG. 3, gate trench 310 includes buried electrode 318 and gate electrode 320 situated above and separated from buried electrode 318 by gate trench dielectrics 312 (e.g., an inter-poly dielectric) in gate trench 310. Doped pillar 322 and buried electrode 318 in gate trench 310 are connected to a source potential, which is also applied to source regions 308a, 308b and 308c, and body contact regions 342a, 342b and 342c. Buried electrode 318 provides the benefit of shielding gate electrode 320 from the electric fields in the underlying epitaxial drain region, thereby substantially reducing the gate-drain capacitance. Doped pillar 322 is situated in drift region 304 and in contact with base region 306b above. The combination of buried electrode 318 and doped pillar 322 offers benefits, such as increased device breakdown voltage with significantly higher drift region doping concentration and hence much lower on-resistance.

As illustrated in FIG. 3, doped pillar 322 is spaced to be substantially centered in the region formed by surrounding gate trench 310. In contrast to conventional semiconductor device in which the width of the silicon mesa is constrained by the minimum size requirement of the contact opening for adequate body/source contact formation, implementations of the present application utilize cellular structures each having doped pillar 322 below base region 306b and surrounded by gate trench 310, where doped pillar 322 is electrically coupled to source contact 338 through base region 306b and body contact region 342b, thus not covered by gate dielectric cap 332. As a result, mesa width 336 between gate trench 310 and doped pillar 322 can be substantially reduced, while body/source contact opening width 334 remains sufficiently large to meet the minimum size requirement of the contact opening to ensure adequate body/source contact formation. As can be seen in FIG. 3, body/source contact opening width 334 spans the width of doped pillar 322 and is large enough to achieve a void-free metal fill in the contact opening. Thus, mesa width 336 can be reduced down to much smaller values than conventional trench type semiconductor devices, while enabling the use of higher doping concentration in drift region 304 to lower $R_{DSon}$.

The unique construction of gate trench 310 and doped pillar 322 can improve avalanche performance as compared to a conventional trench type semiconductor device, in which the entire hole current generated during an avalanche condition flows along a gate electrode and traverses under a source region before being collected by a body contact, making the semiconductor device susceptible to parasitic bipolar turn-on. During regular operation, gate electrode 320 can be utilized to selectively enable and disable semiconductor device 300 by modulating channels adjacent gate trench dielectrics 312 in base regions 306a, 306b and 306c. However, during, for example, unclamped inductive switching, semiconductor device 300 may be connected to an inductor and experience a rapid change in current. When semiconductor device 300 is on, energy is stored in the inductor. When semiconductor device 300 is switched off, the inductor dissipates the stored energy into semiconductor device 300 by driving it into an avalanche condition, resulting in elevated junction temperature of semiconductor device 300. In the avalanche condition, impact ionization of electron-hole pairs can generate avalanche current between drain region 302 of semiconductor device 300 and base regions 306a, 306b and 306c of semiconductor device 300. The avalanche condition poses a threat of damaging semiconductor device 300, which may result in shift of device parameters such as threshold voltage (Vth), on-state resistance ($R_{DSon}$), and drain to source leakage (Idss).

In the present implementation, semiconductor device 300 includes doped pillar 322, which is surrounded by gate trench 310. Doped pillar 322 is configured to provide respective enhanced avalanche current paths from drain region 302 to respective ones of base regions 306a, 306b and 306c when semiconductor device 300 is in an avalanche condition. In semiconductor device 300, if without doped pillar 322, each avalanche current path from drain region 302 to respective ones of base regions 306a, 306b and 306c can traverse drift region 304 adjacent respective bottom 316 and sidewalls 314 of gate trench 310. High electric fields during an avalanche condition can concentrate along bottom 316 and sidewalls 314 of gate trench 310. At high temperatures, these high electric fields along with high avalanche current densities may result in carriers being injected into gate trench dielectrics 312. This can cause significant shift of device parameters such as, for example, threshold voltage (Vth), on-state resistance ($R_{DSon}$), and drain to source leakage (Idss) and can compromise the ruggedness of semiconductor device 300.

With the presence of doped pillar 322, however, much of the avalanche current is diverted away from gate trench 310 during an avalanche condition. As such, high electric fields and avalanche current densities may be concentrated at the p-n junction formed between doped pillar 322 and drift region 304, thereby significantly reducing or eliminating the risk of carriers being injected into gate trench dielectrics 312. In other words, the impact ionization is triggered along doped pillar 322, with a fraction of the avalanche current flowing along sidewalls 314 of gate trench 310, and the remainder of the avalanche current flowing substantially vertically up doped pillar 322. Thus, doped pillar 322 is configured to effectively contain the high electric field in drift region 304, and divert the avalanche current from sidewalls 314 of gate trench 310 thereby significantly reducing the threat of damaging semiconductor device 300.

Furthermore, the diverted avalanche current that flows substantially vertically up doped pillar 322 has direct access to body contact region 342b without having to traverse under source region 308b. In turn, only a fraction of the avalanche current flows along gate trench 310 and traverses under source region 308b before being collected by body contact region 342b. As a result, semiconductor device 300 is substantially immune from parasitic bipolar turn-on, and can substantially avoid or minimize parametric shift due to repetitive avalanche conditions. Thus, semiconductor device 300 has enhanced avalanche ruggedness as compared to conventional trench type semiconductor devices.

In the present implementation, semiconductor device 300 is a trench type MOSFET and can have various configurations and features, which may be different than what is specifically shown. In one implementation, gate trench 310 and doped pillar 322 may have the same critical dimensions and depth. In another implementation, depending on the application requirements, the critical dimensions, depth and dielectric thickness of gate trench 310 and doped pillar 322 may be optimized independently of each other to offer the best device performance.

From the above description it is manifest that various techniques can be used for implementing the concepts described in the present application without departing from the scope of those concepts. Moreover, while the concepts have been described with specific reference to certain implementations, a person of ordinary skill in the art would recognize that changes can be made in form and detail without departing from the scope of those concepts. As such, the described implementations are to be considered in all respects as illustrative and not restrictive. It should also be understood that the present application is not limited to the particular implementations described above, but many rearrangements, modifications, and substitutions are possible without departing from the scope of the present disclosure.

The invention claimed is:

1. A semiconductor device, comprising:
a semiconductor substrate having a base region situated over a drift region;
a source trench extending through said base region and into said drift region, said source trench having a shield electrode; and
a gate trench extending through said base region and into said drift region, said gate trench having a gate electrode situated above a buried electrode,
wherein said source trench is separated from said gate trench on all sides by said base region,
wherein said source trench and said gate trench are non-intersecting.

2. The semiconductor device of claim 1, wherein said source trench is surrounded by said gate trench.

3. The semiconductor device of claim 1, wherein said shield electrode is coupled to a source contact over said semiconductor substrate.

4. The semiconductor device of claim further comprising a source region over said base region.

5. The semiconductor device of claim 4, wherein said source region is electrically coupled to said shield electrode.

6. The semiconductor device of claim 1, wherein said gate trench includes gate trench dielectrics lining a bottom and sidewalls of said gate trench.

7. The semiconductor device of claim 1, wherein said source trench includes source trench dielectrics lining a bottom and sidewalls of said source trench.

8. The semiconductor device of claim 1, wherein said shield electrode in said source trench and said buried electrode in said gate trench are coupled to a source potential.

9. A semiconductor device, comprising:
a semiconductor substrate having a base region situated over a drift region;
a doped pillar portion of the semiconductor substrate extending into said drift region;
a gate trench extending through said base region and into said drift region;
said gate trench surrounding said doped pillar, said gate trench having a gate electrode situated above a buried electrode.

10. The semiconductor device of claim 9, wherein said doped pillar is situated below said base region.

11. The semiconductor device of claim 9, wherein said doped pillar is situated below and coupled to a source contact.

12. The semiconductor device of claim 9, wherein said gate trench includes gate trench dielectrics lining a bottom and sidewalls of said gate trench.

13. The semiconductor device of claim 9, wherein said buried electrode is insulated from said gate electrode in said gate trench.

14. The semiconductor device of claim 9, wherein said doped pillar and said buried electrode are coupled to a source potential.

15. A transistor, comprising:
a semiconductor substrate having a drift region situated over a drain region, and a base region situated over said drift region;
a source trench extending through said base region and into said drift region, said source trench having a shield electrode; and
a gate trench extending through said base region and into said drift region, said gate trench having a gate electrode situated above a buried electrode,
wherein said source trench is separated from said gate trench on all sides by said base region,
wherein said source trench and said gate trench are non-intersecting.

16. The transistor of claim 15, wherein said source trench is surrounded by said gate trench.

17. The transistor of claim 15, further comprising source regions situated over said base region and electrically coupled to said shield electrode.

18. The transistor of claim 15, wherein said source trench includes source trench dielectrics on a bottom and sidewalls of said source trench.

19. The transistor of claim 15, wherein said gate trench includes gate trench dielectrics on a bottom and sidewalls of said gate trench.

20. The transistor of claim 15, wherein said shield electrode in said source trench and said buried electrode in said gate trench are coupled to a source potential.

* * * * *

UNITED STATES PATENT AND TRADEMARK OFFICE
CERTIFICATE OF CORRECTION

PATENT NO.       : 9,673,318 B1
APPLICATION NO.  : 14/995049
DATED            : June 6, 2017
INVENTOR(S)      : A. Mirchandani et al.

Page 1 of 1

It is certified that error appears in the above-identified patent and that said Letters Patent is hereby corrected as shown below:

In the Claims

Claim 4 (Column 11, Line 34), "claim further" please change --claim 1, further--.

Signed and Sealed this
Twenty-second Day of August, 2017

Joseph Matal
*Performing the Functions and Duties of the*
*Under Secretary of Commerce for Intellectual Property and*
*Director of the United States Patent and Trademark Office*